(12) United States Patent
Nakayoshi et al.

(10) Patent No.: US 7,071,576 B2
(45) Date of Patent: Jul. 4, 2006

(54) SEMICONDUCTOR DEVICE AND METHOD OF MANUFACTURING THE SAME

(75) Inventors: Hideo Nakayoshi, Yokohama (JP); Chiaki Takubo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/846,672

(22) Filed: May 17, 2004

(65) Prior Publication Data

US 2005/0006766 A1 Jan. 13, 2005

(30) Foreign Application Priority Data

Jun. 30, 2003 (JP) .............................. 2003-188503

(51) Int. Cl.
*H01L 23/29* (2006.01)
(52) U.S. Cl. ...................... 257/788; 257/789; 257/790; 257/795
(58) Field of Classification Search ................ 257/780, 257/778, 759, 788, 790, 792, 795, E21.119
See application file for complete search history.

(56) References Cited

U.S. PATENT DOCUMENTS 4,675,985 A * 6/1987 Goto ........................ 156/331.1

5,734,201 A * 3/1998 Djennas et al. ............. 257/783
6,538,315 B1 * 3/2003 Bessho et al. .............. 257/698
6,750,550 B1 * 6/2004 Yamakawa et al. ......... 257/783

FOREIGN PATENT DOCUMENTS

| JP | 2000-58592 | 2/2000 |
|----|-----------|--------|
| JP | 2000-133683 | 5/2000 |
| JP | 2000-323605 | 11/2000 |
| JP | 2001-244362 | 9/2001 |
| JP | 2002-141436 | 5/2002 |
| JP | 2002-170848 | * 6/2002 |

OTHER PUBLICATIONS

Notification of Reasons for Rejection Issued by Japanese Patent Office mailed Mar. 7, 2006, in Japanese application No. 2003-188503, and English translation of Notice.

* cited by examiner

*Primary Examiner*—Jasmine Clark
(74) *Attorney, Agent, or Firm*—Finnegan, Henderson, Farabow, Garrett & Dunner, L.L.P.

(57) ABSTRACT

A semiconductor device includes a semiconductor substrate, a first wiring arranged on the semiconductor substrate, a first electrode pad electrically connected to the first wiring, and a porous organic resin film covering the front surface of the semiconductor substrate such that the first electrode pad is exposed to the outside.

20 Claims, 5 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2003-188503, filed Jun. 30, 2003, the entire contents of which are incorporated herein by reference.

BACKGROUND OF THE INVENTION

1. Field of the Invention

The present invention relates to a semiconductor device, particularly, to a semiconductor device having a packaged semiconductor chip and a method of manufacturing the same.

2. Description of the Related Art

In recent years, a high operating speed and the miniaturization of the semiconductor element mounted inside a semiconductor device are being promoted with progress in the operating speed of the semiconductor device and in the function performed by the semi-conductor device. Also, the miniaturization of the semiconductor element is promoted by the formation of a fine multi-wiring in the semiconductor element.

However, the miniaturization causes an increase in the parasitic capacitance between the adjacent wirings included in the semiconductor element so as to lower the operating speed of the semiconductor element. Such being the situation, the interlayer insulating film formed between the adjacent wirings is formed of a low dielectric constant film (low-k film) in order to suppress the parasitic capacitance between the adjacent wirings. As a result, the parasitic capacitance between the adjacent wirings is lowered so as to suppress the lowering in the operating speed of the semiconductor element.

Also, in order to further decrease the dielectric constant of the low-k film, the low-k film is made porous in place of a film having a high density such as a $SiO_2$ film. It is possible to further decrease the parasitic capacitance between the adjacent wirings by using such a porous low-k film as an interlayer insulating film, with the result that it is possible to prevent the operating speed of the semiconductor element from being lowered.

On the other hand, a BGA (Ball Grid Array) of, for example, a flip-chip type is being propagated as a semiconductor package capable of coping with the high operating speed and the miniaturization required in recent years. In the flip-chip type BGA, a semi-conductor element is mounted to a package substrate having a multi-layered wiring of a high density such that the surface of the semiconductor element equipped with electrode pads of the semiconductor element is allowed to face the package substrate. In the mounting step, the package substrate is connected to the semiconductor element by the C4 (Controlled Collapse Chip Connection) technology using as a solder bump and, then, the clearance between the package substrate and the semiconductor element is sealed by an under-fill.

As a relating technology of this kind, Japanese Patent Disclosure (Kokai) No. 2001-244362 discloses a flip-chip type BGA having a low thermal resistance.

However, in the case of using a porous low-k film as an interlayer insulating film included in the semiconductor element, the mechanical strength of the low-k film is lowered. Therefore, since the semiconductor element is mounted to the package substrate such that the surface of the semiconductor element is allowed to face the package substrate in, for example, the flip-chip type BGA referred to above, stress is generated within the semiconductor element because of the difference in the thermal expansion coefficient between the package substrate and the semiconductor element. As a result, a serious problem is generated that the low-k film having the lowered mechanical strength is broken.

BRIEF SUMMARY OF THE INVENTION

According to a first aspect of the present invention, there is provided a semiconductor device, including a semiconductor substrate; a first wiring arranged on the semiconductor substrate; a first electrode pad electrically connected to the first wiring; and a porous organic resin film covering the front surface of the semiconductor substrate such that the first electrode pad is exposed to the outside.

According to a second aspect of the present invention, there is provided a semiconductor device, including a semiconductor element having a front surface, which is provided with an electrode pad, covered with a porous organic resin film; a package substrate having a mounting surface to which is mounted the semiconductor element such that a back surface opposite to the front surface noted above is mounted to the package substrate; a package wiring arranged within the package substrate and electrically connected to the electrode pad; and a molding resin layer arranged on the package substrate so as to cover the semiconductor element.

According to a third aspect of the present invention, there is provided a semiconductor device, including a semiconductor substrate which has terminals; a package which is provided on the substrate and which has a semiconductor element and electrode pads electrically connected to the terminals; and an organic resin film which is porous and which fills a gap between the substrate and the package.

Further, According to a fourth aspect of the present invention, there is provided a method of manufacturing a semiconductor device, including forming a semiconductor element having a first electrode pad formed on a front surface; cutting a porous organic resin film to conform with the shape of the front surface of the semiconductor element; forming a hole in that portion of the cut porous organic resin film which corresponds to the first electrode pad; and bonding the porous organic resin film provided with the hole to the front surface of the semiconductor element.

DETAILED DESCRIPTION OF THE INVENTION

Some embodiments of the present invention will now be described with reference to the accompanying drawings.

(First Embodiment)

Figure 1:
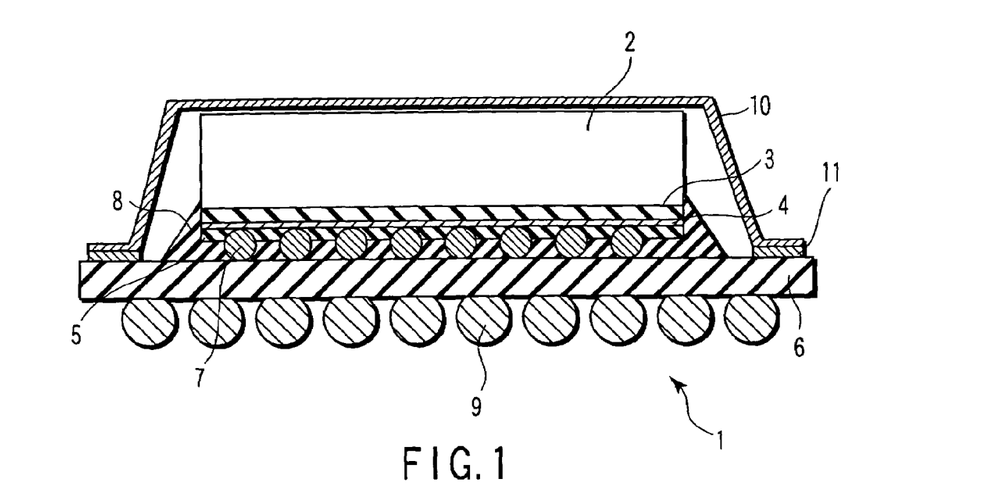
FIG. 1 is a cross sectional view showing the construction of a semiconductor device 1 according to a first embodiment of the present invention.

FIG. 1 is a cross sectional view showing the construction of a semiconductor device 1 according to a first embodiment of the present invention. As shown in the drawing, a semiconductor chip 2 comprises a porous low-k film 3 as an interlayer insulating film. In the first embodiment of the present invention, the term "low-k" film denotes an insulating film having a dielectric constant lower than 3. The low-k material includes, for example, $SiO_xC_y$. It is also possible to use an organic film such as a film having $C_xH_y$ structure as the low-k material. Further, the low-k film 3 is prepared by making the low-k material porous. As a result, it is possible to decrease the dielectric constant of the low-k film 3.

The semiconductor chip 2 includes an IC wiring 4, which includes an electrode pad (not shown) used as an external connection terminal of the semiconductor chip 2.

A porous organic resin film 5 is formed on that front surface of the semiconductor chip 2 on which is arranged the IC wiring 4. The organic resin material used for forming the organic resin film 5 includes, for example, an epoxy resin and a polyimide resin. Further, the organic resin film 5 is prepared by making porous the organic resin material referred to above. The organic resin film 5 according to the first embodiment of the present invention has a porosity of 40 to 70%. Incidentally, the term "porosity" noted above represents a ratio of the volume of the pore to the volume of the organic resin film 5. The construction of the organic resin material referred to above is no more than an example. Of course, the construction of the organic resin material is not limited to the construction exemplified above.

A package substrate 6 is formed of an epoxy resin substrate provided with at least one layer of Cu wirings (not shown).

Solder balls 9 are formed on one surface of the package substrate 6 so as to be electrically connected to the Cu wiring.

The semiconductor chip 2 and the package substrate 6 are joined to each other by solder bumps 7. To be more specific, the semiconductor chip 2 and the package substrate 6 are arranged such that the front surface of the semiconductor chip 2 is allowed to face that surface of the package substrate 6 which is opposite to the surface on which the solder balls 9 are arranged. Also, the IC wiring 4 of the semiconductor chip 2 is electrically connected to the Cu wiring of the package substrate 6 by the solder bumps 7.

The clearance between the organic resin film 5 and the package substrate 6 and the side surface of the organic resin film 5 are sealed by an under-fill 8. The under-fill 8 is formed of, for example, an epoxy resin.

A heat dissipating plate 10 is formed a prescribed distance apart from the semiconductor chip 2 in a manner to cover the semiconductor chip 2. The heat dissipating plate 10 is formed of, for example, copper. Incidentally, a reinforcing plate 11 is mounted to the package substrate 6. The heat dissipating plate 10 is fixed to the reinforcing plate 11.

The method of manufacturing the semiconductor device shown in FIG. 1 will now be described with reference to FIGS. 1 to 3.

Figure 2:
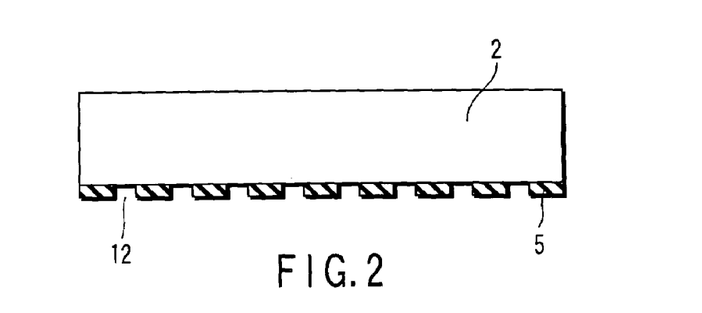
FIG. 2 is a cross sectional view used for describing the first step in the manufacturing method of the semiconductor device 1 of the construction shown in FIG. 1.

As shown in FIG. 2, a porous organic resin film 5 is formed on that front surface of the semiconductor chip 2 on which an electrode pad (not shown) is arranged. Incidentally, bump holes 12 are formed in advance in those portions of the organic resin film 5 which correspond to the positions of the electrode pads of the semiconductor chip 2. The bump holes 12 are sized to permit the solder bumps 7 to be connected to the electrode pads of the semiconductor chip 2.

In the next step, the positions of the electrode pads of the semiconductor chip 2 and the bump holes 12 are aligned, and the organic resin film 5 is bonded by a thermo compression to the semiconductor chip 2. Also, before formation of the organic resin film 5, the solder bump 7 are melted and connected to the electrode pads of the semiconductor chip 2. Then, the front surface of the semiconductor chip 2 is coated with an uncured porous organic resin, followed thermally curing the porous organic resin. Further, the organic resin film coated on the solder bump 7 is etched so as to form the organic resin film 5.

Figure 3:
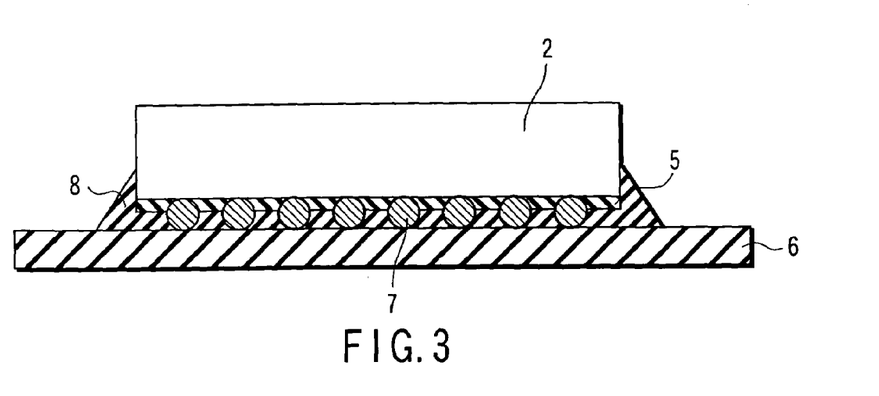
FIG. 3 is a cross sectional view showing the step after the step shown in FIG. 2 included in the manufacturing method of the semiconductor device 1.

In the next step, the solder bumps 7 are melted and connected to the electrode pads of the semi-conductor chip 2, as shown in FIG. 3.

Then, the package substrate 6 is formed. To be more specific, a Cu wiring of a single layer or a multi-layered structure having a prescribed wiring pattern is formed within an epoxy resin layer. In the case of a multi-layered Cu wiring, epoxy resin films are laminated between the adjacent wiring layers so as to form the package substrate 6. The Cu wiring can also be formed by, for example, a dual damascene method. Further, an electrode pad (not shown) is formed so as to be exposed to the surface of the package substrate 6 that is electrically connected to the Cu wiring. Then, the reinforcing plate 11 is formed in that position of the surface of the package substrate 6 to which the heat dissipating plate 10 is mounted.

In the next step, the semiconductor chip 2 and the package substrate 6 are bonded to each other by a flip-chip system. To be more specific, the semiconductor chip 2 and the package substrate 6 are arranged such that the front surface of the semiconductor chip 2 is allowed to face the surface of the package substrate 6, and the solder bumps 7 formed on the semiconductor chip 2 and the electrode pad of the package substrate 6 are melted and joined to each other.

In the next step, the clearance between the organic resin film 5 and the package substrate 6 is loaded with an appropriate amount of, for example, an epoxy resin, and the epoxy resin is cured at an appropriate temperature. As a result, the under-fill 8 is formed.

In the next step, the heat dissipating plate 10 having a prescribed shape is arranged on the surface of the package substrate 6 in FIG. 1, and the heat dissipating plate 10 is bonded to the reinforcing plate 11 by using, for example, a resin.

After the heat dissipating plate 10 is bonded to the reinforcing plate 11, the solder balls 9 are melted and bonded to the back surface of the package substrate 6 on which the semiconductor chip 2 is not mounted such that the solder balls 9 are electrically connected to the Cu wiring of the package substrate 6. As a result, manufactured is the semiconductor device 1 shown in FIG. 1.

In the semiconductor device of the construction described above, the thermal expansion coefficient of the package substrate 6 is larger than the thermal expansion coefficient of the semiconductor chip 2. When the semiconductor chip 2 and the package substrate 6 are being thermally expanded by the heat treatment during the manufacturing process, the stress generated within the semiconductor chip 2 is small. However, if the temperature of the semiconductor device 1 is lowered to room temperature, the package substrate 6 markedly contracts, compared with the semiconductor chip 2.

In the first embodiment of the present invention, the porous organic resin 5 is formed on the front surface of the semiconductor chip 2. As a result, the stress generated by the contraction of the package substrate 6 is generated in the porous organic resin film 5 via the under-fill 8. It follows that the stress noted above is absorbed by the porous organic resin film so as to make it possible to suppress the stress generated within the semiconductor chip 2.

Where the porous low-k film 3 is used as an interlayer insulating film of the semiconductor chip 2, the effect produced by the reduction of the stress generated in the semiconductor chip 2 is increased. It should be noted that the mechanical strength of the porous low-k film 3 is very weak, compared with that of, for example, $SiO_2$. Further, since the low-k film is made porous, the contact area with the contiguous film is rendered small. It follows that the low-k film 3 tends to be broken and peeled off by the stress generated in the semiconductor chip 2. However, since the porous organic resin film 5 serves to lower the stress generated in the semiconductor chip 2, the porous low-k film 3 can be prevented from being broken or peeled off.

The manufacturing method of the semiconductor device 20 provided with a porous organic resin film will now be described with reference to FIGS. 4 and 6.

Figure 4:
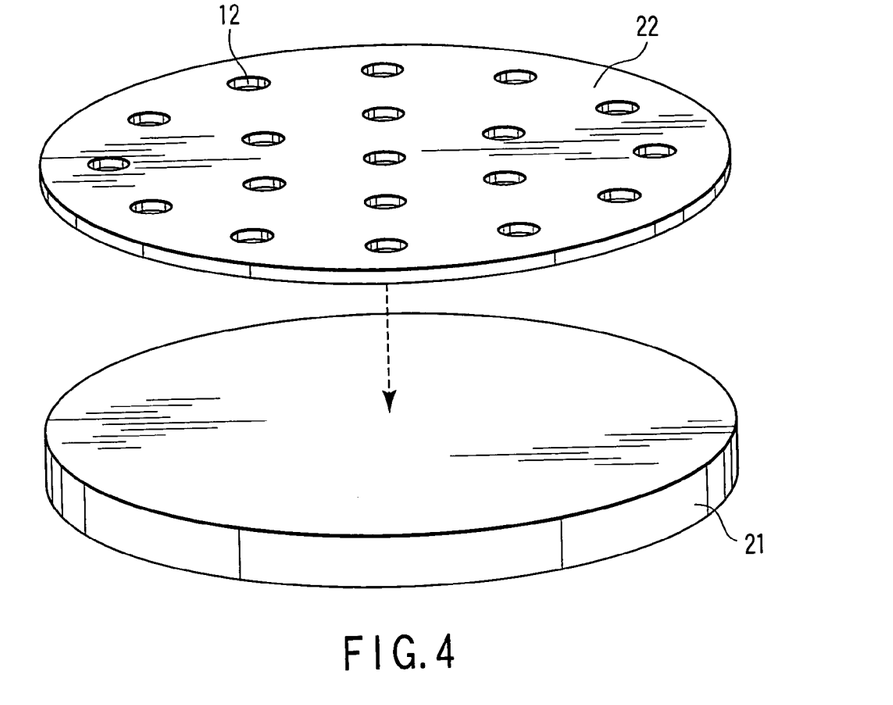
FIG. 4 is an oblique view showing the manufacturing method of a semiconductor device 20 provided with a porous organic resin film.
Figure 5:
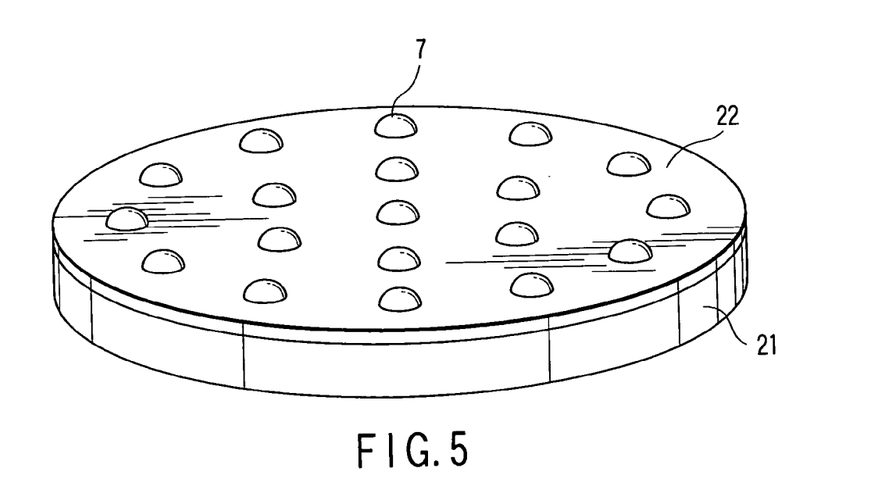
FIG. 5 is an oblique view for describing the manufacturing method of the semiconductor device 20 after the step shown in FIG. 4.

In the first step, prepared is a semiconductor wafer 21 having a prescribed shape, as shown in FIG. 4. An electrode pad (not shown) acting as a connection terminal is formed on the surface of the semiconductor wafer 21.

In the next step, also prepared is a porous organic resin film 22, as shown in FIG. 4. To be more specific, a porous organic resin film is cut into a shape equal to that of the semiconductor wafer 21. Then, a plurality of bump holes 12 aligned with the positions of the electrode pads of the semiconductor wafer 21 and sized to permit the solder bumps 7 to be connected to the electrode pads of the semiconductor wafer 21 are formed in the organic resin film by, for example, an etching treatment. In this fashion, prepared is the organic resin film 22 referred to above.

In the next step, the semiconductor wafer 21 and the organic resin film 22 are bonded by the thermo compression to each other as shown in FIG. 5. Then, the solder bumps 7, which are aligned with the positions of the bump holes 12, are melted and connected to the electrode pads of the semiconductor wafer 21.

Figure 6:
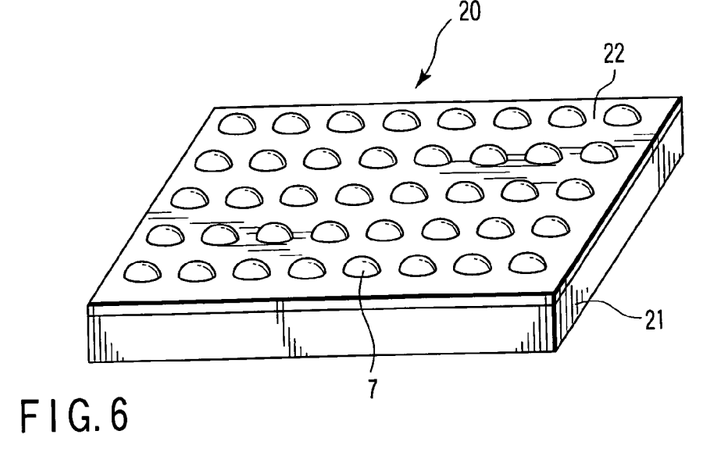
FIG. 6 is an oblique view for describing the manufacturing method of the semiconductor device 20 after the step shown in FIG. 5.

In the next step, the connected structure is divided into the semiconductor device 20 of a prescribed size by means of, for example, dicing, as shown in FIG. 6, thereby obtaining the semiconductor device 20. Incidentally, the semiconductor device 20 shown in FIG. 6 corresponds to the structure including the semiconductor chip 2, the porous organic resin film 5 and the solder bumps 7 included in the semiconductor device 1 shown in FIG. 1.

Another method of manufacturing the semiconductor device 20 provided with a porous organic resin film will now be described with reference to FIGS. 5 to 7.

Figure 7:
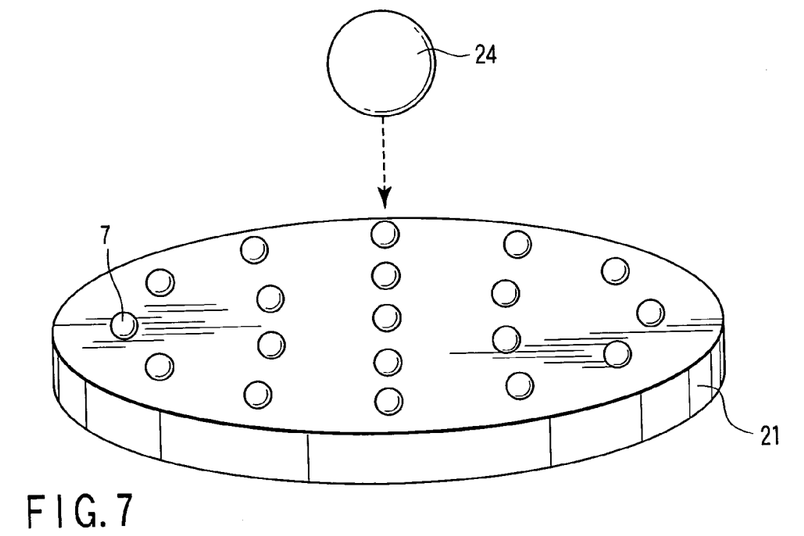
FIG. 7 is an oblique view showing another manufacturing method of the semiconductor device 20 provided with a porous organic resin film.

In the first step, a semiconductor wafer 21 of a prescribed shape is formed as shown in FIG. 7. An electrode pad (not shown) acting as a connecting terminal is formed on the surface of the semiconductor wafer 21. Then, the solder bumps 7 are melted and connected to the electrode pads of the semiconductor wafer 21.

In the next step, an uncured porous organic resin 24 is dripped onto the surface of the semiconductor wafer 21, followed by coating the surface of the semiconductor wafer 21 with the organic resin 24. The coating can be performed by, for example, a rotary coating method in which the semiconductor wafer 21 is rotated so as to expand the organic resin 24, thereby forming a thin film.

In the next step, the porous organic resin 24 is thermally cured. Incidentally, the drawing for describing the particular manufacturing method is similar to FIG. 5 and, thus, the drawing is omitted. Then, the organic resin 24 coated on the solder bumps 7 is etched so as to form the organic resin film 22.

After formation of the organic resin film 22, the resultant structure is divided into the semiconductor device 20 of a prescribed size by means of, for example, dicing, thereby obtaining the semiconductor device 20.

As described above, in the first embodiment of the present invention, the porous organic resin film 5 is formed on the front surface of the semiconductor chip 2 that is flip-chip connected. It follows that, according to the first embodiment of the present invention, it is possible to suppress the stress given to the semiconductor chip 2 by the difference in thermal expansion coefficient between the semiconductor chip 2 and the package substrate 6. As a result, it is possible to prevent the low-k film 3 formed within the semiconductor chip 2 from being broken or peeled off.

It is also possible to suppress the stress given to the semiconductor chip 2 by the difference in thermal expansion coefficient between the semiconductor chip 2 and the under-fill 8. Further, it is possible to suppress the stress generated within the semi-conductor chip 2 via the solder bumps 7 by the difference in thermal expansion coefficient between the semiconductor chip 2 and the package substrate 6.

Also, in the first embodiment of the present invention, the porous low-k film 3 is used as an interlayer insulating film of the semiconductor chip 2. However, the organic resin film 5 produces the similar effect of suppressing the stress as far as the organic resin film 5 if formed of an insulating material having a mechanical strength lower than that of $SiO_2$. To be more specific, it is of course possible for the low-k film, which is not porous, to produce the similar effect, too. Incidentally, the insulating material having a low mechanical strength has desirably the Young's modulus not higher than 50 GPa.

Incidentally, the present inventor has experimentally confirmed that it is possible for the porous organic resin film 5 to produce a more desirable effect in the case where the porosity of the porous organic resin film 5 falls within a range of between 40% and 70%.

(Second Embodiment)

The second embodiment of the present invention is directed to a semiconductor device formed by CSP (Chip Scale Package).

Figure 8:
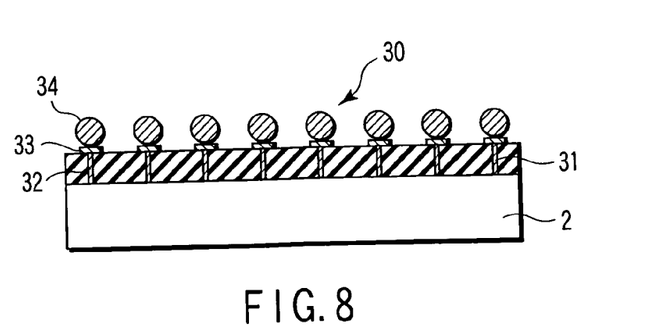
FIG. 8 is a cross sectional view showing the construction of a semiconductor device 30 according to a second embodiment of the present invention.

FIG. 8 is a cross sectional view showing the construction of a semiconductor device 30 according to the second embodiment of the present invention. Incidentally, the semiconductor chip 2 included in the semiconductor device 30 is equal in construction to the semiconductor chip 2 included in the semiconductor device according to the first embodiment of the present invention.

In the second embodiment of the present invention, a porous organic resin film 31 is formed on the front surface of the semiconductor chip 2. The porous organic resin film 31 is equal in construction to the organic resin film 5 described previously.

Electrode pads 33 corresponding to the electrode pads of the semiconductor chip 2 are formed on that surface of the organic resin film 31 which is opposite to the surface on which the semiconductor chip 2 is mounted. The electrode pads of the semiconductor chip 2 are electrically connected to the electrode pads 33 noted above via a Cu wiring 32. Also, solder balls 34 are electrically connected to the electrode pads 33.

The manufacturing method of the semiconductor device 30 shown in FIG. 8 will now be described with reference to FIGS. 8 and 9.

Figure 9:
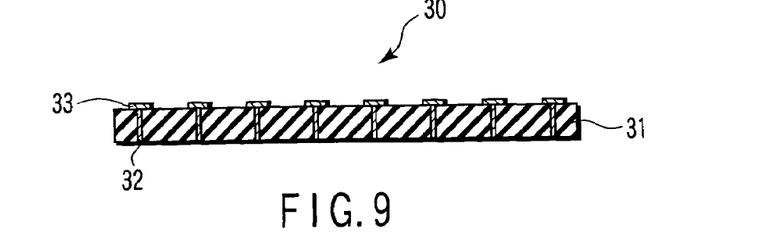
FIG. 9 is a cross sectional view for describing the manufacturing method of the semiconductor device 30 constructed as shown in FIG. 8.

As shown in FIG. 9, the porous organic resin film 31 having a prescribed thickness is formed in the shape equal to the shape of the front surface of the semiconductor chip 2. Also, a single layer or a multi-layered Cu wiring 32 is formed within the organic resin film 31. In the case of the multi-layered wiring, the organic resin film 31 is formed by laminating a plurality of organic resin films as interlayer insulating films. Further, Cu wirings 32 are formed at the positions of the electrode pads of the semi-conductor chip 2 on the surface of the organic resin film 31 in contact with the front surface of the semiconductor chip 2. Incidentally, it is possible for the Cu wiring 32 to be a via plug serving to electrically connect the electrode pad of the semi-conductor chip 2 to the electrode pad 33.

In the next step, the electrode pads 33 are formed on the back surface of the organic resin film 31 so as to be electrically connected to the Cu wirings 32. The electrode pads 33 can be formed by, for example, patterning an Al film by the photolithography method.

Further, the solder balls 34 are formed on the electrode pads 33 so as to be electrically connected to the electrode pads 33, as shown in FIG. 8.

After formation of the solder balls 34, the surface of the organic resin film 31 is bonded to the front surface of the semiconductor chip 2 such that the electrode pads of the semiconductor chip 2 are electrically connected to the Cu wirings 32 formed on the surface of the organic resin film 31. To be more specific, the organic resin film 31 is attached by the thermo compression to the semiconductor chip 2, thereby manufacturing the semiconductor device 30 shown in FIG. 8.

In the semiconductor device of the construction described above, the organic resin film 31 constitutes a CSP that also acts as a package substrate.

As described above, in the second embodiment of the present invention, the porous organic resin film 31 is formed on the front surface of the semiconductor chip 2. Further, the organic resin film 31 is provided with the Cu wirings 32 of a single layer or a multi-layered structure and with the solder balls 34 acting as the external connection terminals.

Such being the situation, according to the second embodiment of the present invention, it is possible to suppress the stress given to the semiconductor chip 2 and generated by the difference in the thermal expansion coefficient between, for example, the package substrate connected to the solder balls 34 and the semiconductor chip 2. As a result, it is possible to prevent the low-k film 3 formed within the semi-conductor chip 2 from being broken or peeled off.

Also, it is possible for the porous organic resin film 31 to act also as a package substrate.

What should also be noted is that, since the semiconductor device 30 constitutes the CSP, it is possible to conduct a burn-in test. As a result, it is possible to select the good article of the semi-conductor chip 2 included in the semiconductor device 30 so as to improve the yield of manufacture of, for example, an MCM (Multi Chip Module) having a plurality of semiconductor devices 30 mounted thereto.

(Third Embodiment)

In the third embodiment of the present invention, a semiconductor device is manufactured by packaging a semiconductor chip having a porous organic resin film formed on the surface by using a PBGA (Plastic Ball Grid Array).

Figure 10:
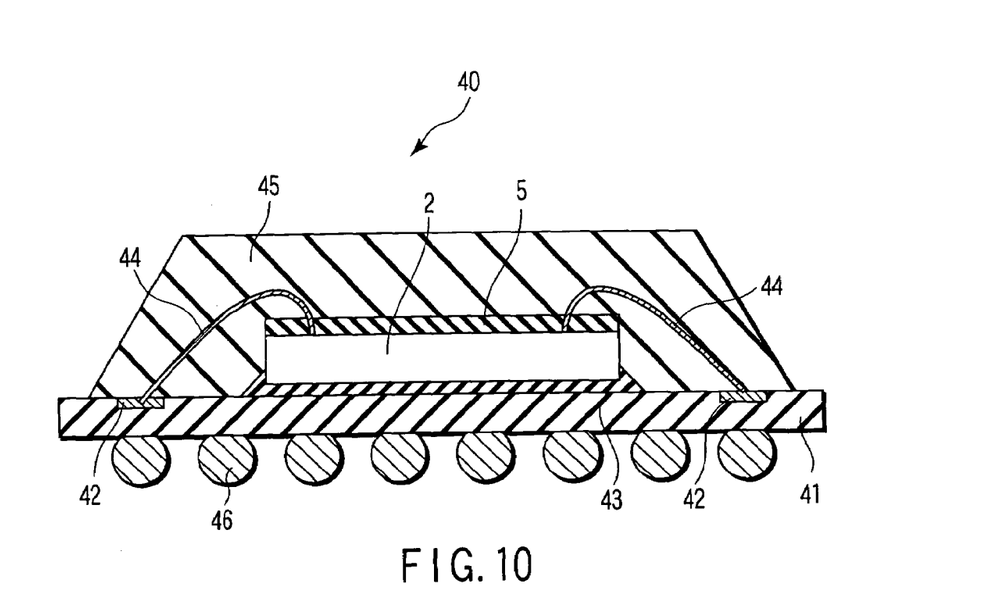
FIG. 10 is a cross sectional view showing the construction of a semiconductor device 40 according to a third embodiment of the present invention.

FIG. 10 is a cross sectional view showing the construction of a semiconductor device 40 according to the third embodiment of the present invention. Incidentally, the semiconductor chip 2 and the organic resin film 5 shown in FIG. 10 are equal in construction to those included in the semiconductor device according to the first embodiment of the present invention described previously.

A package substrate 41 shown in FIG. 10 is formed of an epoxy resin substrate having a Cu wiring (not shown) of at least a single layer structure formed thereon. A bonding pad 42 consisting of a part of the Cu wiring is formed on the front surface of the package substrate 41 in a manner to be exposed to the outside.

The back surface of the semiconductor chip 2 is bonded to the front surface of the package substrate 41 with an adhesive section 43, which is formed of, for example, resin.

The electrode pads of the semiconductor chip 2 are electrically connected to the bonding pads 42 of the package substrate 41 by a bonding wire 44, which is formed of, for example, a Au wire.

A molding resin 45 is formed on the package substrate 41 in a manner to cover the semiconductor chip 2, the bonding wires 44 and the bonding pads 42. The molding resin 45 is formed of, for example, an epoxy resin.

Solder balls 46 are formed on the back surface of the package substrate 41 so as to be electrically connected to the Cu wiring of the package substrate 41.

The manufacturing method of the semiconductor device 40 shown in FIG. 10 will now be described with reference to FIGS. 10 and 11.

Figure 11:
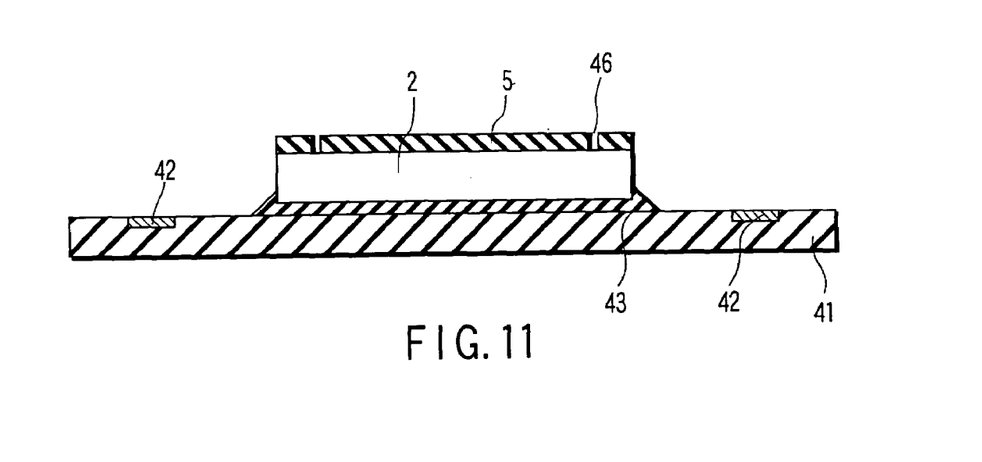
FIG. 11 is a cross sectional view for describing the manufacturing method of the semiconductor device 40 constructed as shown in FIG. 10.

As shown in FIG. 11, the porous organic resin film 5 is formed on that front surface of the semiconductor chip 2 on which the electrode pads (not shown) are formed. A wire hole 46 is formed by etching in that position of the organic resin film 5 which corresponds to the position of the electrode pad of the semi-conductor chip 2. The wire hole 46 is sized to permit the bonding wire 44 to be connected to the electrode pad of the semiconductor chip 2.

In the next step, the positions of the electrode pad of the semiconductor chip 2 and wire hole 46 are aligned and, then, the organic resin film 5 is bonded by the thermo compression to the semiconductor chip 2. Also, the front surface of the semiconductor chip 2 is coated with an uncured porous organic resin, followed by thermally curing the organic resin. Then, it is possible to form the organic resin film 5 by etching the cured organic resin layer such that the electrode pad of the semiconductor chip 2 is exposed to the outside.

In the next step, the package substrate 41 is formed. To be more specific, a single layer or a multi-layered Cu wiring having a desired wiring patterning applied thereto is formed within an epoxy resin. In the case of a multi-layered Cu wiring, the package substrate 41 is formed by laminating a plurality of epoxy resin films between the adjacent wiring layers. Also, the Cu wiring is formed by, for example, a dual damascene method. Further, the bonding pads 42 are formed so as to be electrically connected to the Cu wiring and exposed to the surface of the epoxy resin layer.

Then, the back surface of the semiconductor chip 2 is bonded to the front surface of the package substrate 41 by the adhesive section 43.

Further, the electrode pads of the semiconductor chip 2 are electrically connected to the bonding pads 42 by the bonding wires 44, as shown in FIG. 10. Still further, the molding resin 45 is formed in a manner to cover the semiconductor chip 2, the bonding wires 44 and the bonding pads 42. After formation of the molding resin 45, the solder balls 46 are formed on the back surface of the package substrate 41 so as to be electrically connected to the Cu wiring of the package substrate 41.

In the semiconductor device 40 of the construction described above, the thermal expansion coefficient of the molding resin 45 is larger than the thermal expansion coefficient of the semiconductor chip 2. When the semiconductor chip 2 and the molding resin 45 are being thermally expanded during the heat treatment included in the manufacturing process, the stress generated within the semiconductor chip 2 is small. However, if the temperature of the semiconductor device 40 is lowered to room temperature, the molding resin 45 contracts more greatly than the semiconductor chip 2.

In the third embodiment of the present invention, the porous organic resin film 5 is formed on the front surface of the semiconductor chip 2. Therefore, the stress caused by the contraction of the molding resin 45 is generated within the organic resin film 5. As a result, the stress noted above is absorbed by the porous organic resin film 5 so as to make it possible to suppress the stress generated in the semiconductor chip 2.

Incidentally, the effect produced in the case of using the porous low-k film 3 for forming the interlayer insulating film included in the semi-conductor chip 2 is substantially equal to that described previously in conjunction with the first embodiment of the present invention.

As described above in detail, in the third embodiment of the present invention, the porous organic resin film 5 is formed on the front surface of the semiconductor chip 2 mounted within the semiconductor device 40 constituted by the PBGA package. It follows that, according to the third embodiment of the present invention, it is possible to suppress the stress given to the semiconductor chip 2 and generated by the difference in the thermal expansion coefficient between the semiconductor chip 2 and the molding resin 45. As a result, the low-k film 3 formed within the semi-conductor chip 2 can be prevented from being broken or peeled off.

Also, it is possible for an additional porous organic resin film to be formed on the back surface of the semiconductor chip 2. In this case, it is possible to suppress the stress given to the semiconductor chip 2 and generated by the difference in the thermal expansion coefficient between the semiconductor chip 2 and the package substrate 41. Further, it is also possible to suppress the stress given to the semi-conductor chip 2 and generated by the difference in the thermal expansion coefficient between the semiconductor chip 2 and the adhesive section 43.

Incidentally, the kinds of the packages are not limited to the flip-chip type BGA employed in the first embodiment of the present invention and to the PBGA employed in the third embodiment of the present invention. The technical idea of the present invention can similarly be applied as in each of the embodiments described above when it comes to a package in which an insulating material differing in the thermal expansion coefficient from the semiconductor chip 2 is present in the vicinity of the semiconductor chip 2. To be more specific, where the insulating material layer formed in the vicinity of the semiconductor chip 2 differs from the semiconductor chip 2 in the thermal expansion coefficient, it is possible to suppress the stress given to the semiconductor chip 2 by forming a porous organic resin film on the contact surface between the semiconductor chip 2 and the insulating material layer.

(Fourth Embodiment)

The fourth embodiment of this invention is a semiconductor device that has a logic board and a packaged semiconductor chip mounted on the logic board. The logic board is, for example, the main circuit board of an electronic apparatus.

Figure 12:
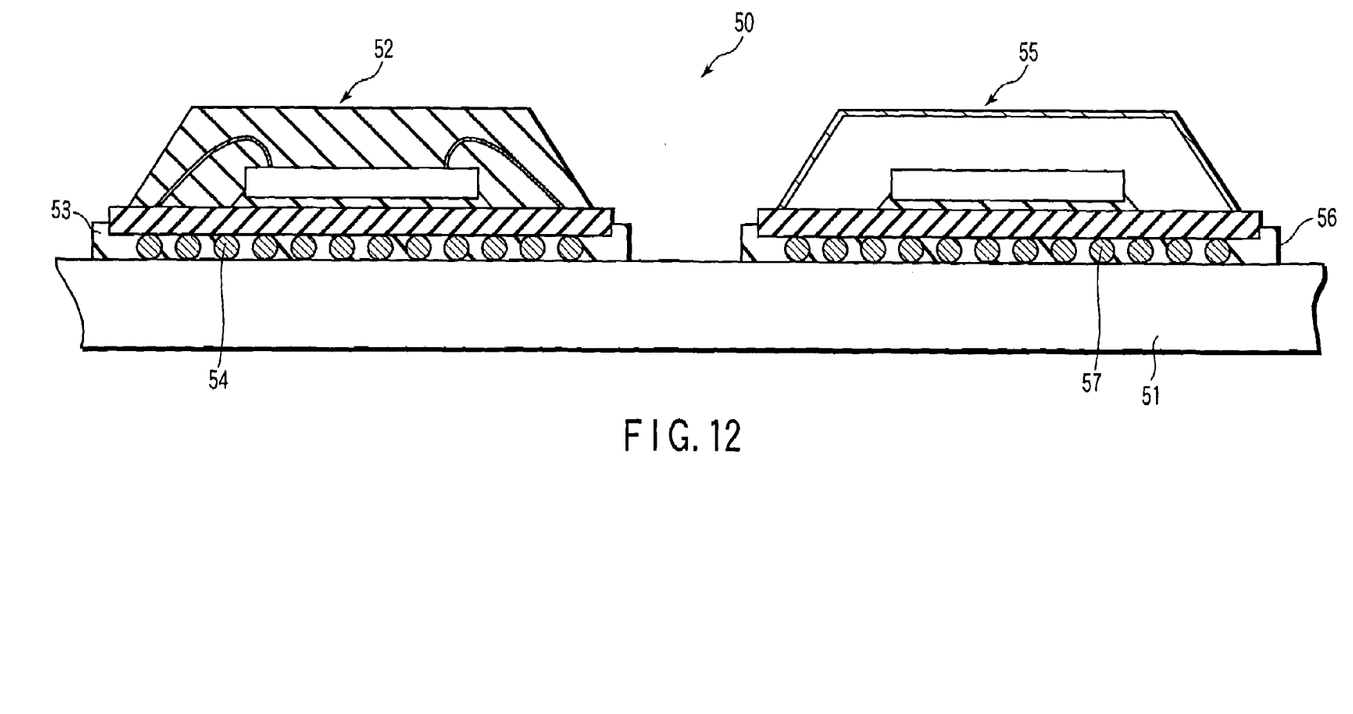
FIG. 12 is a cross sectional view o showing the construction of a semiconductor device 50 according to a fourth embodiment of the present invention.

FIG. 12 is a sectional view of a semiconductor device 50 that is the fourth embodiment of the invention. As FIG. 12 shows, the device 50 has a logic board 51, a PBGA-packaged chip 52, and a BGA-packaged, flip-chip type chip 55.

The logic board 51 is the main circuit board of, for example, an electronic apparatus. The board 51 is a multi-layered structure and has many circuit elements. It has connection terminals (not shown), which are to be connected to external devices.

Both packaged chips 52 and 55 are mounted on the logic board 51. The chip 52 has solder balls 54. The chip 55 has solder balls 57, too. The solder balls 54 are connected to some of the connection terminals of the logic board 51. The solder balls 57 are connected to the other connection terminals.

An organic resin film 53 is interposed between the logic board 51 and the chip 52, covering the solder balls 54 and filling the gap between the board 51 and the chip 52. The film 53 is made of, for example, epoxy resin or polyimide resin. Further, the film 53 is porous, having a porosity of 40 to 70%. Note that the material of the film 53 is not limited to epoxy resin and polyimide resin, both exemplified above.

A porous organic resin film 56 is interposed between the logic board 51 and the chip 55. This film 56 is identical in properties to the resin film 53.

The semiconductor device 50 may be heated and subjected to a test, for example, a temperature cycling test (TCT). When the device 50 is heated, the logic board 51 and the substrate of each packaged chip undergo thermal expansion. The thermal expansion applies a stress to the solder balls 54 that connect the device 52 to the logic board 51.

Without the organic resin film 53, the solder balls 54 should be broken by fatigue, due to the stress. Consequently, the device 50 should become defective. In this embodiment, the organic resin film 53 absorbs the stress, preventing the solder balls 54 from being broken by fatigue. This renders the production yield of the semiconductor device 50.

The third embodiment is not limited to a semiconductor device that has a PBGA-packaged chip and a BGA-packaged chip. It can be applied to semi-conductor devices having any other types of packaged chips.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor element having a front surface on which an electrode pad is provided, the front surface being covered with a porous organic resin film;
an electrode electrically connected to the electrode pad;
a package substrate having a mounting surface to which the semiconductor element is mounted such that the front surface of the semiconductor element is mounted to the package substrate;
a package wiring arranged within the package substrate and electrically connected to the electrode; and
a sealing section sealing a clearance between the organic resin film and the package substrate.

2. The semiconductor device according to claim 1, wherein the organic resin film has a porosity of 40% to 70%.

3. The semiconductor device according to claim 1, wherein: the package substrate is formed of an organic resin material; and
the organic resin film has a porosity higher than that of the package substrate.

4. The semiconductor device according to claim 1, wherein:
the sealing section is formed of an organic resin material; and
the organic resin film has a porosity higher than that of the sealing section.

5. The semiconductor device according to claim 1, wherein the semiconductor element includes an interlayer insulating film made of an insulating material having a mechanical strength lower than that of $SiO_2$ and formed between a semiconductor substrate of the semiconductor element and the organic resin film.

6. The semiconductor device according to claim 1, wherein the semiconductor element includes an interlayer insulating film having a dielectric constant lower than 3 and formed between a semiconductor substrate of the semiconductor element and the organic resin film.

7. The semiconductor device according to claim 6, wherein the interlayer insulating film is porous.

8. A semiconductor device comprising:
a semiconductor element having a front surface on which an electrode pad is provided, the front surface being covered with a porous organic resin film;
a package substrate having a mounting surface to which the semiconductor element is mounted such that a back surface opposite to the front surface of the semiconductor element is mounted to the package substrate; and
a molding resin layer arranged on the package substrate so as to cover the semiconductor element,
wherein the semiconductor element includes an interlayer insulating film having a dielectric constant lower than 3 and formed between a semiconductor substrate of the semiconductor element and the organic resin film.

9. The semiconductor device according to claim 8, wherein the organic resin film has a porosity of 40% to 70%.

10. The semiconductor device according to claim 8, wherein the organic resin film has a porosity higher than that of the molding resin layer.

11. The semiconductor device according to claim 8, wherein the interlayer insulating film consists of an insulating material having a mechanical strength lower than that of $SiO_2$.

12. A semiconductor device comprising:
a semiconductor substrate which has terminals;
a package which is provided on the substrate and which has a semiconductor element and electrode pads electrically connected to the terminals; and
an organic resin film which is porous and which fills a gap between the substrate and the package.

13. The semiconductor device according to claim 12, wherein the organic resin film has a porosity of 40 to 70%.

14. A semiconductor device comprising:
a semiconductor element;
a first wiring arranged on a front surface of the semiconductor element;
a porous organic resin film covering the front surface of the semiconductor element;
a second wiring arranged within the organic resin film and electrically connected to the first wiring; and
an electrode arranged on the organic resin film and electrically connected to the second wiring.

15. The semiconductor device according to claim 14, wherein the organic resin film has a porosity of 40% to 70%.

16. The semiconductor device according to claim 14, further comprising an electrode pad arranged between the organic resin film and the electrode, and electrically connecting the second wiring to the electrode.

17. The semiconductor device according to claim 14, wherein the second wiring is a conductive plug which electrically connects the first wiring to the electrode.

18. The semiconductor device according to claim 14, wherein the semiconductor element includes an interlayer insulating film made of an insulating material having a mechanical strength lower than that of $SiO_2$ and formed between a semiconductor substrate of the semiconductor element and the organic resin film.

19. The semiconductor device according to claim 14, wherein the semiconductor element includes an interlayer insulating film having a dielectric constant lower than 3 and formed between a semiconductor substrate of the semiconductor element and the organic resin film.

20. The semiconductor device according to claim 8, further comprising a package wiring arranged within the package substrate, and a bonding wire electrically connecting the electrode pad to the package wiring.

* * * * *